(12) United States Patent
Castagna et al.

(10) Patent No.: US 8,644,073 B2
(45) Date of Patent: Feb. 4, 2014

(54) NON-VOLATILE MEMORY DEVICE WITH IMPROVED PROGRAMMING MANAGEMENT AND RELATED METHOD

(75) Inventors: Guiseppe Castagna, Palermo (IT); Rosanna Badalamenti, Casteldaccia (IT); Maurizio Perroni, Furnari (IT)

(73) Assignee: STMicroelectronics S.R.L., Agrate Brianza (MB) (IT)

( * ) Notice: Subject to any disclaimer, the term of this patent is extended or adjusted under 35 U.S.C. 154(b) by 177 days.

(21) Appl. No.: 13/398,181

(22) Filed: Feb. 16, 2012

(65) Prior Publication Data

US 2012/0221804 A1     Aug. 30, 2012

(30) Foreign Application Priority Data

Feb. 28, 2011    (IT) .............................. MI2011A0310

(51) Int. Cl.
   *G11C 11/34*    (2006.01)
(52) U.S. Cl.
   USPC ............. 365/185.12; 365/185.17; 365/185.22
(58) Field of Classification Search
   USPC ........................... 365/185.12, 185.17, 185.22
   See application file for complete search history.

(56) References Cited

U.S. PATENT DOCUMENTS

| 5,430,674 | A | 7/1995 | Javanifard |
| 7,724,570 | B1 | 5/2010 | Lindhorst et al. |
| 7,986,557 | B2 * | 7/2011 | Tokiwa et al. ........... 365/185.17 |
| 2002/0194422 | A1 | 12/2002 | Cohen et al. |
| 2004/0213068 | A1 | 10/2004 | Matsue |

FOREIGN PATENT DOCUMENTS

EP        1420415        5/2004

* cited by examiner

*Primary Examiner* — Son Dinh
*Assistant Examiner* — Nam Nguyen
(74) *Attorney, Agent, or Firm* — Allen, Dyer, Doppelt, Milbrath & Gilchrist, P.A.

(57) ABSTRACT

A non-volatile memory device includes a plurality of memory cells, with each memory cell for storing a bit having a first logic value or a second logic value. An input is for receiving a word defined by bits to be stored in the plurality of memory cells. Programming circuitry is for programming a corresponding memory cell for each bit having the first logic value. Forming circuitry is for receiving the word from the input and for providing to the programming circuitry at least one additional word defined by bits to also be stored in the plurality of memory cells. The forming circuitry includes processing circuitry for calculating a current maximum number of simultaneously programmable bits, and logic circuitry for generating the additional word, with the additional word having a number of bits having the first logic value equal to the current maximum number.

25 Claims, 4 Drawing Sheets

NON-VOLATILE MEMORY DEVICE WITH IMPROVED PROGRAMMING MANAGEMENT AND RELATED METHOD

FIELD OF THE INVENTION

The present invention relates to electronics, and, more specifically, to non-volatile memory devices.

BACKGROUND OF THE INVENTION

Non-volatile memory devices are commonly used in many different types of electronic systems (e.g., computers, mobile phones, PDAs, etc.) that require the storage of binary data or bits of information that are to be maintained even when the memory devices are not powered.

For example, electrically erasable and programmable non-volatile memory devices, also identified by the acronym EEPROM (Electrically Erasable Programmable Read Only Memory), have reached a widespread use in the electronic applications market, from an industrial level to the consumer level. Such wide distribution is due to special features, such as the ability to maintain information without power being supplied, to allow the editing of information itself, and to ensure greater reliability and robustness than other memory devices, such as magnetic-disk memory devices.

Flash memory devices are currently the most commonly used type of EEPROM devices since, besides the above mentioned features, they have a very high storage capacity and are at the same time very small. In general, each flash memory device includes a plurality of sectors of memory cells electrically erasable and programmable. Each sector is formed in a respective electrically isolated well of the chip. Each memory cell typically includes an n-channel MOS transistor with a floating gate structure. Such a transistor has a collection electrode (drain), a source electrode (source) and a control electrode (gate) in a completely similar way as a standard MOS transistor, but with the addition of a further floating control electrode (floating gate) that is buried in an oxide layer that is to be electrically isolated.

The information bit is physically stored in each memory cell in the form of an electric charge in the floating gate, which defines a corresponding threshold voltage of the transistor. In particular, the memory cell is erased to a low threshold voltage (floating gate essentially free from electrical charges), for example, equivalent to a high logic value, and programmed to a high threshold voltage (electrical charges trapped in the floating gate), for example, equivalent to a low logic value. In flash memory devices the programming may be performed on memory cells individually selected, while the erasing may be performed on entire selected sectors (even simultaneously on multiple of them). Each memory cell has to absorb certain amounts of electrical power for being successfully programmed or erased.

The current trend of electronic systems development is towards an ever greater data processing speed, and involves the need to develop non-volatile memory devices that can read/program bits faster and faster, mainly through parallel access to an ever-larger amount of memory cells. At the same time, a tendency has developed to reduce the operating voltages (scaling) of electronic devices. This is to reduce electrical power consumptions, which ensures a greater autonomy to battery-powered portable electronic systems. These devices currently occupy an increasing share of the market by way of the electronic products in which they are implemented.

Unfortunately, the increased speed and reduced power consumption are parameters in conflict with one another. The maximum electrical power available during each programming operation defines the maximum amount of memory cells that may simultaneously undergo the programming operation. In other words, the maximum available electrical power imposes a limit on the number of parallel programmable cells, and then, also on the programming speed of the memory device.

The approaches currently developed seem to prefer a tradeoff between the speed and power consumption of the memory devices. For example, in the first case, devices are provided with a dedicated power circuit (e.g., charge pump voltage multiplier circuits) to provide greater electrical power to allow simultaneous programming of an increased number of memory cells. However, applying such an approach results in the area of the memory device and its power consumption being increased, which increases both production costs and operating costs thereof.

Another more popular approach involves splitting a word of binary data, which is used for data processing in the electronic system in which the memory device is implemented, into segments according to the number of parallel programmable cells. The splitting is performed by an appropriate filter circuitry that divides the word of binary data in segments. The segments have a bit length corresponding to the number of memory cells that may be parallel programmed. This is defined by the maximum electrical power available for each programming operation.

The programming operation of the whole word is then divided into a number of subsequent programming cycles equal to the number of segments in which the word was divided. In particular, during each programming cycle the bits at a low logic value included in the segment are identified and programmed in the corresponding memory cells. This approach allows management of the programming of bit words having a large size.

However, the programming operation of the whole word requires multiple cycles, thus requiring a programming time that is often considerable, and which increases with the word length. For example, a memory device may be able to parallel program 16 memory cells, while the electronic system in which it is implemented operates with 64-bit words. In these conditions, the filter circuitry divides each word into four segments of 16 bits each, which is to be analyzed and programmed in four consecutive programming cycles. Consequently, the memory device will be occupied for four consecutive cycles for each word being programmed.

SUMMARY OF THE INVENTION

In general terms, the present invention is based on determining a quantity of cells to be parallel programmed according to the performance that is achievable by the memory device during separate programming of the same cells.

More specifically, one aspect of the present invention is to provide a non-volatile memory device that includes a plurality of memory cells, where each memory cell is adapted to store binary data having either a first logic value or a second logic value. The non-volatile memory device may also include input means or an for receiving a word of binary data to be stored in the memory cells, and programming means or programming circuitry to associate and program, for each binary data at the first logic value, a corresponding memory cell.

According to one embodiment of the present invention, the non-volatile memory device may further include forming means or a forming block/circuitry to receive the word of binary data and to generate and provide to the programming circuitry at least one additional word of binary data to be stored. The forming block may include detection means or a detector for periodically detecting at least one operating parameter of the memory device.

The forming block may also include processing means or processing circuitry for dynamically calculating a current maximum number of simultaneously programmable bits, according to detection of the at least one operating parameter and at least a characteristic parameter of the memory cells of which the memory device is made. The forming block may further include logic means or logic circuitry for generating the at least one additional word of binary data to be stored with a number of binary data at the first logic value equal to the current maximum number.

Another aspect of the present invention relates to a corresponding method of programming a non-volatile memory.

BRIEF DESCRIPTION OF THE DRAWINGS

One or more embodiments of the invention, as well as additional features and related advantages, will be better understood with reference to the following detailed description. The embodiments are provided merely by way of exemplary and non-limiting purposes, to be read in conjunction with the attached drawings.

In the attached drawings, corresponding elements are designated with the same or similar references, and their explanation is not repeated for the sake of being brief. In this regard, it is expressly understood that the figures are not necessarily to scale (with some details that may be exaggerated and/or simplified), and unless otherwise stated, they are simply used to conceptually illustrate the described structures and procedures. In particular.

DETAILED DESCRIPTION OF THE PREFERRED EMBODIMENTS

Figure 1:
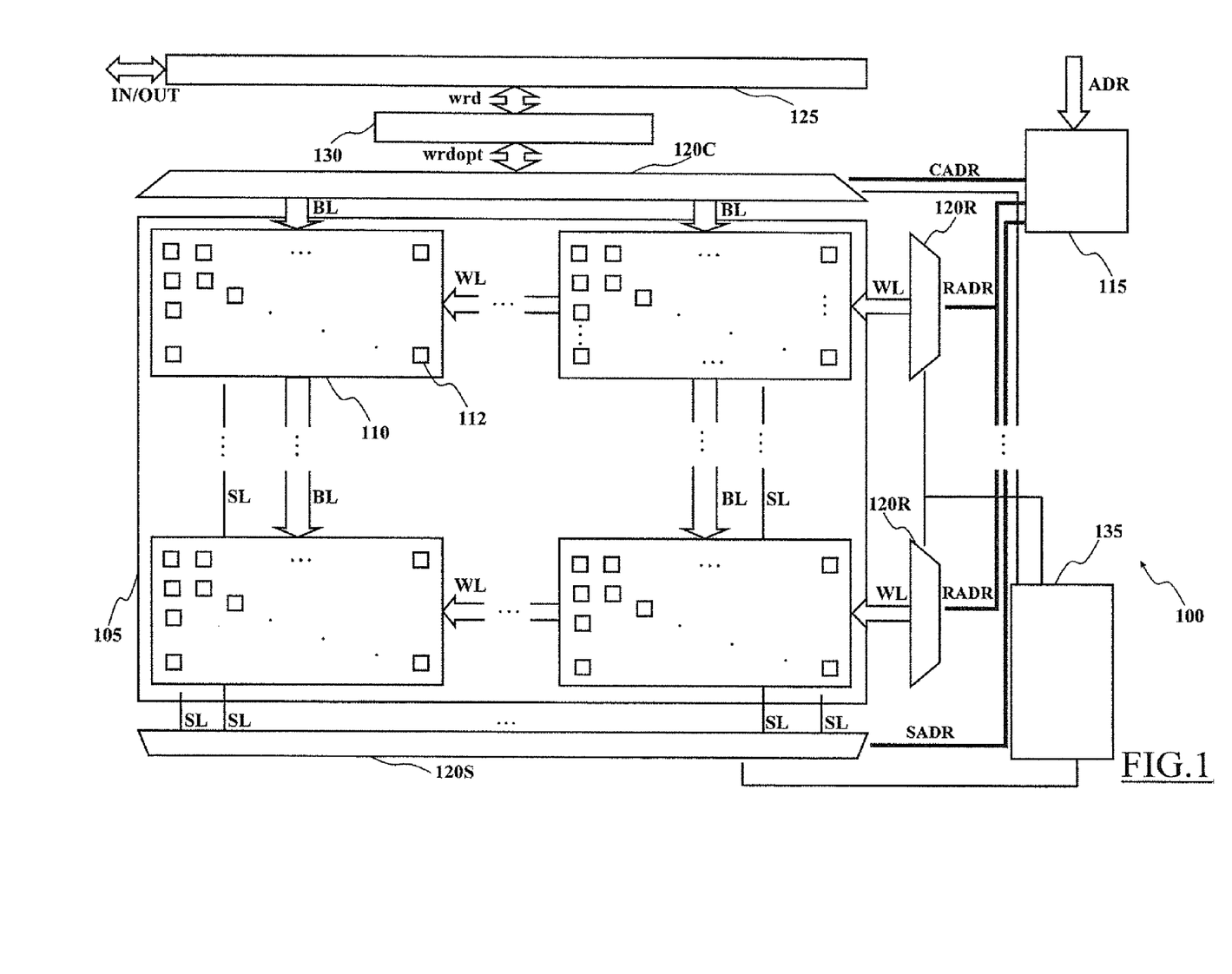
FIG. 1 is a block diagram of a non-volatile memory device including a forming block according to one embodiment of the present invention.

With reference to FIG. 1, a block diagram of a non-volatile memory device 100 is provided in which an embodiment of the present invention is applicable. In particular, and purely by way of example, the non-volatile memory device 100 belongs to an EEPROM (Electrically Erasable Programmable Read Only Memory) type memory, and even more particularly, to a flash type memory. Nothing, however, prohibits applying the invention to other different types of memory devices.

The flash memory device 100 is integrated into a chip of semiconductor material. The flash memory device 100 includes a memory matrix 105, which is formed by a plurality of sectors 110 (four of which are shown) of electrically erasable and programmable memory cells 112 arranged in rows and columns (e.g., 128-512 rows and 512-1024 columns). Each sector 110 is formed in a respective well that is electrically isolated from the others chip wells.

In each memory cell 112, it is possible to store binary data (i.e., a bit) by modifying a threshold voltage of a floating gate transistor included therein. The binary data can take two logic values, usually identified with the numbers 0 and 1, respectively.

The matrix 105 includes a plurality of Bit Lines BL, each for accessing a column of memory cells in a column of sectors 110 of the matrix 105, and a plurality of Word Lines WL, each for accessing a row of memory cells in one row of the sector 110 of the matrix. The matrix 105 also includes a plurality of Sector Lines SL, each for accessing a well in which memory cells of each sector 110 are formed.

The memory cells 112 are selected through a corresponding address ADR provided to the flash memory device 100 by an external electronic element (e.g., by a microcontroller) at each operation on the matrix 105. The flash memory device 100 includes an address decoder 115, which starting from the received address ADR, generates a row address RADR, a column address CADR and a sector address SADR.

The row address RADR is fed to row selectors 120R, included in the memory device 100, in number corresponding to the number of the rows of the sectors 110 of the matrix 105. This is to select the corresponding word line(s) WL in response to the row address RADR. The column address CADR is fed to a column selector 120C to select the bit line(s) BL in response to the column address CADR.

The sector address SADR is fed to a sector selector 120S to select the wells of the sectors 110 in response to the sector address SADR. In this embodiment, the column selector 120C interfaces with an input/output (I/O) block 125. The I/O block 125 includes circuits used to perform the various operations on the selected memory cells (e.g., biasing circuits, reading circuits, comparators, etc.) via a forming block 130.

The I/O block 125 receives an input vector of x bits (for example, 64 bits) or a word wrd that includes bits to be stored within the memory device 100. This comes from outside or external the memory device 100 (e.g., from the microcontroller that provides the address ADR) through an I/O interface IN/OUT. The forming block 130 provides the column selector 120C with at least one optimized word wrdopt generated from the received word wrd, as will be described in greater detail below.

In addition, the column selector 120C includes at least the necessary circuitry for parallel storing of all the bits of the word wrd. However, the electrical power available for operations of the memory device 100 may be lower than the required electrical power for parallel storing of all the bits of the word wrd.

The flash memory device 100 also includes a driver circuit 135, which provides bias voltage values needed for performing the desired operations of the remaining blocks of the memory device 100. For example, the driver circuit 135 may include power supply circuitry, including a charge pump for generating voltages of a value higher in absolute value than the supply voltage.

Typically, the memory device 100 operates according to a timing signal that synchronizes and times the operations being performed. During operation of the flash memory device 100, on each selected sector 110, programming and reading operations of selected memory cells 112 and an erasing operation of all memory cells 112 of the selected sector 110 may be performed. In particular, each operation starts with receiving and decoding an address ADR by the address decoder 115, which generates the respective row RADR, column CADR and sector SADR addresses. The address ADR usually indicates a plurality of memory cells 112 on which operations may be performed simultaneously.

In case of an erasing operation, the sector selector 120S provides an erasing voltage +Ve (e.g., a voltage of high value equal to 8V, generated by the driver circuit 135) to the wells of the memory cells 112, of the selected sector(s) 110 by the address sector SADR. Meanwhile, the row decoder 120R, according to the row address RADR, provides to the gate electrode of the transistor included in each memory cell 112 in the selected sector(s) 110 an opposite erasing voltage −Ve. This is in relation to the previous example in which a voltage equal to −8V was generated by the driver circuit 135. In this way, in all the memory cells 112 of the selected sector(s) 110 the same binary data (such as the logic value 1) is stored by imposing a first threshold voltage to a floating gate transistor included therein.

During the programming operation, the circuit I/O 125 receives the word wrd provided from outside or external the memory device 100 and transfers it to the forming block 130. Each bit of the word wrd is analyzed to form at least one word wrdopt, each bit of which is associated with a corresponding memory cell in a determined sector 110 through the address ADR provided by the address decoder 115.

Decoding the address ADR allows identifying each memory cell 112 to be programmed to a given binary value opposite to the erasing one (e.g., to a logic value 0) by imposing a second threshold voltage to the floating gate transistor included in the same. Only the row decoder 120R in the selected sector is active and provides a first programming voltage Vpcg (for example, a voltage equal to 9V, generated by the driver circuit 135) on the selected word line(s) WL. At the same time, the column selector 120C provides a second programming voltage Vpd (e.g., a voltage equal to 5V, generated by the driver circuit 135) on the selected bit line(s) BL. During the programming, the sector decoder 120S provides to the selected sector 110 a voltage reference value (e.g., ground). In this way, only the memory cells 112 corresponding to a bit at the logic value 0 in the word provided to the I/O circuit 125 are programmed to the logic value 0.

In the reading operation the row decoder 120R provides a first reading voltage Vrcg (e.g., a voltage equal to 5V, generated by the driver circuit 135) on the selected word line(s) WL. At the same time, the column selector 120C provides a second reading voltage Vrd (e.g., a voltage equal to 1V, generated by the driver circuit 135) on the selected bit line(s) BL. The reading is performed by detecting the intensity of a current imposed by the threshold voltage corresponding to the stored bit in each selected memory cell 112 on the respective bit line BL. The current intensity is detected by the I/O block 125 (via the column selector 120C) which converts it into the corresponding logic value and provides it outside the memory device 100.

Figure 2:
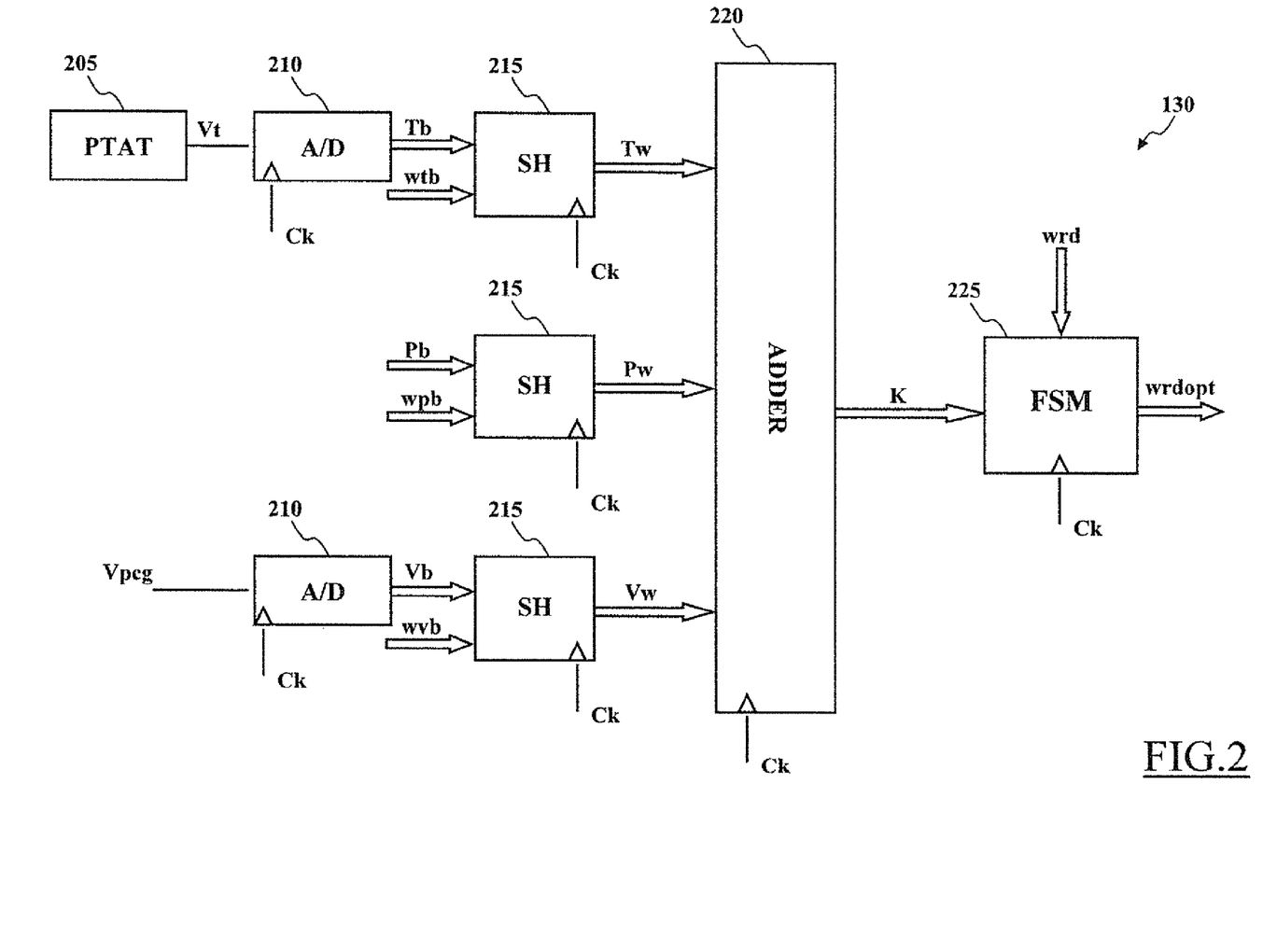
FIG. 2 is a detailed block diagram of the forming block of FIG. 1.

Having described the structure and the general operation of the memory device 100, the forming block 130 will now be described with reference to FIG. 2, which illustrates a functional block diagram of the forming block 130 according to an embodiment of the present invention. It is to be noted that, alternatively, the forming block 130 may be placed outside the memory device 100 and provide the optimized word through the input/output interface IN/OUT.

The operation of the forming block 130 is based on the concept of dynamically defining a maximum number of memory cells 112 on which simultaneous programming is possible to be performed. This object is achieved in the present invention by combining at least one operating variable, whose variations are periodically monitored, with at least one characteristic parameter of the memory cells, such as a parameter defined by a technology with which the memory device 100 is implemented.

The forming block 130 includes a PTAT (Proportional To Absolute Temperature) type circuit 205, which provides a voltage Vt proportional to the temperature of the memory device 100. The forming block 130 also receives the programming voltage Vpcg supplied to the memory cells 112. The voltages Vt and Vpcg are converted into corresponding vectors Tb and Vb of n bits (e.g., 3 bits) through respective analog-to-digital converters 210 on a periodic basis, for example, once for each programming operation in sync with the timing signal Ck.

In addition, the forming block 130 receives as input a vector Pb of n bits, stored, for example, in a reserved region of the memory device 100. This reserved region contains information on a technology parameter of the memory device 100 (e.g., the value of the power absorbed by a single memory cell 112 during the programming). These three vectors Tb, Vb and Pb are inputted to three respective shift registers 215, each of which is also provided with a corresponding weight vector wtb, wvb and wpb of m bits (e.g., 2 bits), for example, each stored in the above mentioned reserved region of the memory device 100.

The weight vectors wtb, wvb and wpb may be determined empirically through analysis performed in design and prototyping phases of the forming block 130. From each shift register 215 a respective product vector Tw, Pw Vw is output corresponding to the product of input bit vectors. The three product vectors Tw, Pw Vw, each of n+m bits are added together by an adder 220, which provides as output a result vector K.

It is important to note that the weight vectors wtb, wvb and wpb are chosen so that the result vector K represents a number corresponding to a power of 2 lower than or equal to the number of bits x composing the binary word wrd. In the case of the above-mentioned example, the vector K may represent the numbers 2, 4, 8, 16, 32 or 64. The result vector K is input to a finite-state machine 225, which also receives the word wrd to be stored in the memory cells 112 through the programming of the same.

The finite-state machine 225 outputs the at least one optimized word wrdopt, as will be explained in more detail in the following. In this way it is ensured that each optimized word wrdopt has a length at most equal to the length of the word wrd, and in any case, is a sub-multiple thereof. It is to be noted that the analog-to-digital converters 210, the shift registers 215, the adder 220 and the finite-state machine 225 receive the timing signal Ck which determines and synchronize respective operating frequencies of the same.

In addition, it is important to consider that all the above mentioned vectors Tb, Vb, Pb, wtb, wvb, wpb, Tw, Vw and Pw may be indifferently transferred both in parallel or serially among the analog-to-digital converters 210, the shift registers 215, the adder 220 and the finite finite-state machine 225 for the purpose of the present invention.

During each programming stage every word wrd is analyzed by the finite-state machine 225 (as will be described in greater detail in the following), by distinguishing between the bits at the logic value 1 and the bits at the logic value 0. Subsequently, an output is provided with at least one optimized word wrdopt (input to the column selector 120C) containing, at most, a number of bits at the logic value 0 equal to the number defined by the vector K. In other words, the word wrd is divided into one or more segments of variable length, i.e., the optimized words wrdopt, from the programming operation of the word wrd to the next according to the maximum number of currently programmable memory cells. The maximum number is indicated by the vector K.

In this way, it is possible to provide an optimized programming according to the current operating condition of the memory device 100. The result vector K defines the maximum number of programmable bits during each separate programming operation according to operating parameters, such as the temperature and the programming voltage Vpcg, and characteristic parameters of the memory cells, such as the current drawn by each memory cell 112 during the programming operation. In other words, the vector K expresses the maximum number of parallel programmable bits during the programming operation according to the maximum electrical power available during each separate programming.

Figure 3:
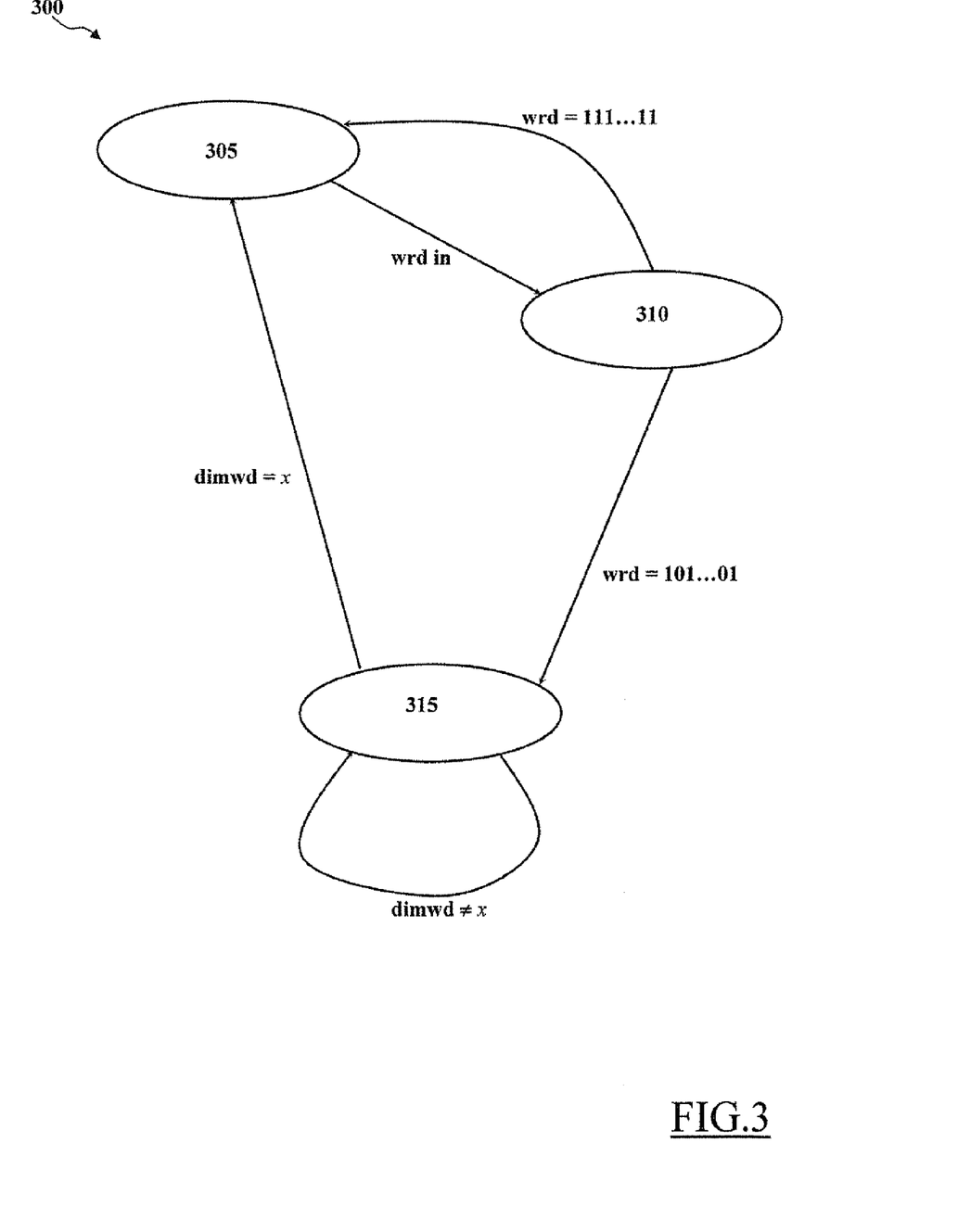
FIG. 3 is a state diagram of the finite-state machine included in the forming block of FIG. 2.

The operation of the finite-state machine 225 may be better understood through reference to FIG. 3, which illustrates a state diagram 300 thereof. The finite-state machine 225 remains in an idle state 305, where no operations are performed, until it receives a word wrd. Following this event, the finite-state machine 225 evolves into an analysis state 310 in which the presence of at least one bit at the logic value 0 (i.e., the need to program at least one memory cell 112 is identified) within the received word wrd is verified.

If no bit at logic value 0 is determined, the finite-state machine transfers the word wrd unaltered to the column selector 120C of the memory device 100 and returns in the idle state 305. On the contrary, if the presence of at least a bit at the logic value 0 is detected, the finite-state machine 225 evolves to a forming state 315. In this forming state 315 the finite-state machine 225 determines a bit of the optimized word wrdopt, and at the same time, increments a word counter dimwd and an optimized word counter dimwo.

The machine remains in this state, repeating it for every period of the timing signal Ck as long as the counter dimwd is lower than the bits number x composing the word wrd. When the counter dimwo exceeds the value of the vector K, the finite-state machine 225 outputs the optimized wrdopt and resets the counter dimwo.

Subsequently, it remains in the forming state 315 to generate a new optimized word wrdopt until the counter dimwd becomes equal to the number x, thus outputting a finite number of additional optimized words wrdopt to the column selector 120C. Finally, the finite-state machine returns to the idle state 305 ready for analyzing the next word wrd.

Figure 4:
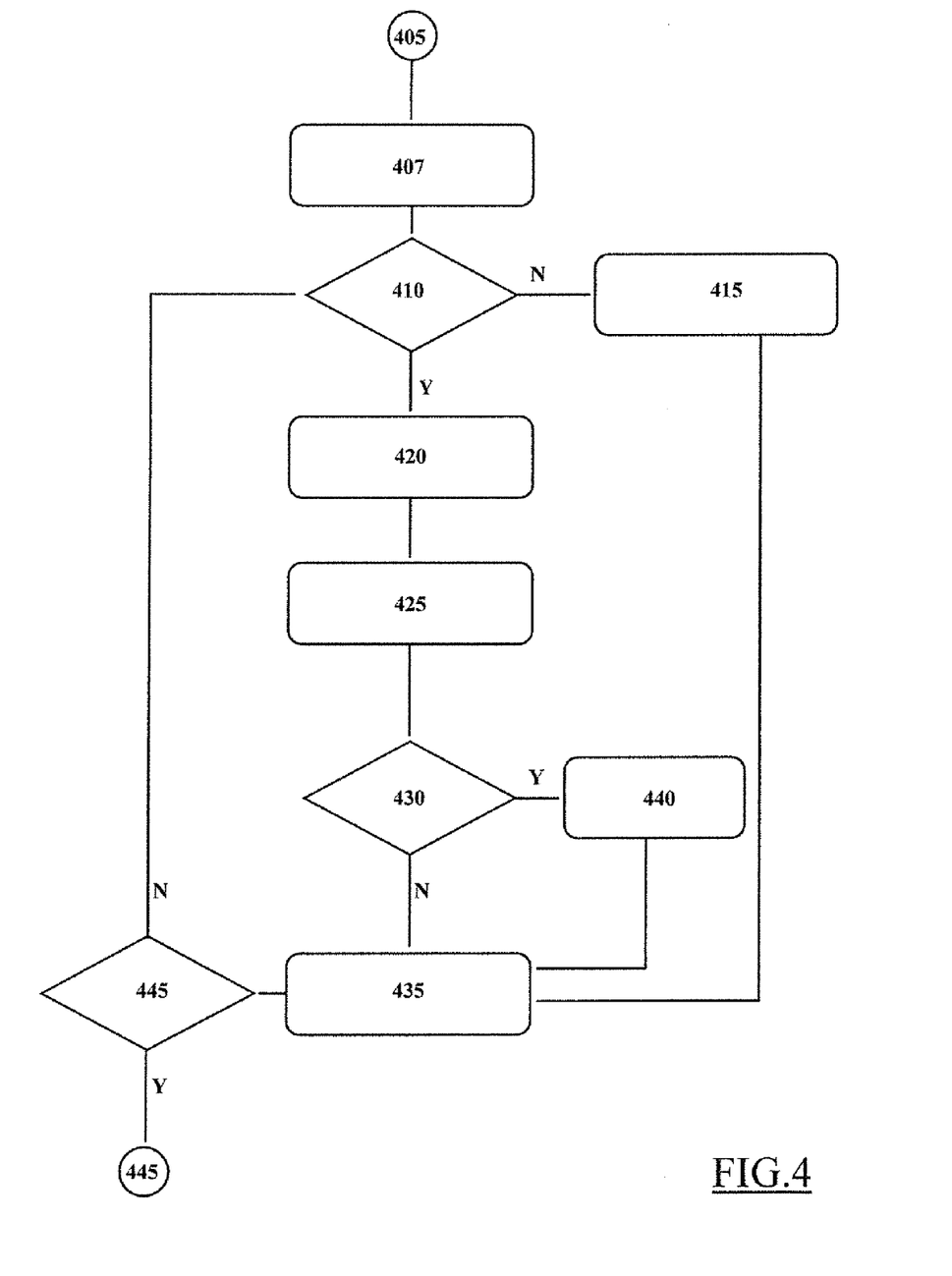
FIG. 4 is a flowchart of the operations performed by the finite-state machine included in the forming block of FIG. 2.

With reference to the flow chart shown in FIG. 4, the operations performed by the finite-state machine 225 while in the forming state 315 will be described in greater detail. At an evolution 405 in the forming state 305 the counters dimwd and dimwo are reset (at a stage 407). At stage 410 it is verified whether a dimwd-th bit of the word wrd, as shown in FIG. 4 as wrd(dimwd), is at the logic value 0. If not, the operation moves to stage 415.

In the affirmative, operation moves to stage 420. In the stage 420 a dimwo-th bit of the optimized word wrdopt at logic value 0 is generated. Subsequently, stage 425 is performed wherein the counter dimwo is incremented by a unity. At a next stage 430 it is checked if the counter dimwo is equal to the number represented by the result vector K.

In the negative, the operation moves to stage 435. On the contrary, the operation moves to stage 440. At stage 440 the optimized word wrdopt is output from the finite-state machine 225, since it has reached the number of bits equal to the maximum number of memory cells 112 currently parallel programmable (indicated by the number represented by the result vector K).

Moreover, the counter dimwo is reset before the operation moves to stage 435 allowing the generation of a further optimized word wrdopt. In addition, at the end of the stage 415, in which the dimwo-th bit of the optimized word wrdopt is brought to a logic value 1, the operation moves also to stage 435. At stage 435 the counter dimwd is incremented by one.

Subsequently, at stage 445 it is checked whether the counter dimwd has a value equal to the number x of bits of the word wrd. In the negative, the verifying of bits of the word wrd is not completed yet, and the operation returns to stage 410 and the forming of the optimized word wrdopt is resumed from the beginning. In the affirmative, the word wrd has been wholly verified, and the finite-state machine exits from the forming state at stage 450. In particular, the vector K will be divided into m=x/|K| optimized words (where |K| indicates the numeric value represented by the vector K).

Every optimized word wrdopt provided to the column selector 120C has a variable length and contains a number of bits at the logic value 0 equal to the value represented by the result vector K. In this way, in each programming cycle it is insured that the programming of the possible maximum number of memory cells 112 is with the available electrical power supplied to the memory device 100. It is therefore clear that, due to the implementation of the forming block 130 inside the memory device 100, the programming performed by the latter becomes faster than the program carried out by known memory devices.

Furthermore, in the embodiments according to the present invention, the programming operation does not require a reprocessing of the address ADR. As a result, the embodiments according to the present invention are easily implemented and involve very low area consumption.

Naturally, to satisfy local and specific requirements, a person skilled in the art may apply logic and/or physical modifications to the embodiments described above. More specifically, although the above embodiments have been described with a certain degree of particularity, it should be understood that various omissions, substitutions and changes are possible.

Different embodiments of the invention may even be practiced without the specific details (such as the numerical examples) set forth in the preceding description to provide a more thorough understanding thereof. Conversely, well-known features may have been omitted or simplified in order not to obscure the description with unnecessary particulars. Moreover, it is expressly intended that specific elements and/or method stages described in connection with any embodiment of the disclosed may be incorporated in any other embodiment as a matter of general design choice.

It should be readily apparent that the proposed structure might be part of the design of an integrated device. The design may also be created in a programming language. In addition, if the designer does not manufacture the integrated device or its masks, the design may be transmitted through physical means to others. Anyway, the resulting integrated device may be distributed by its manufacturer in the form of a raw wafer, as a naked chip, or in packages. Moreover, the proposed structure may be integrated with other circuits in the same chip, or it may be mounted in intermediate products (such as motherboards) and coupled with one or more other chips (such as a processor). In any case, the memory device is adapted to be used in complex systems, such as automotive applications or microcontrollers.

The invention claimed is:

1. A non-volatile memory device comprising:
   a plurality of memory cells, each memory cell configured to store a bit having a first logic value or a second logic value;
   an input configured to receive a word defined by bits to be stored in said plurality of memory cells;
   programming circuitry configured to program a corresponding memory cell for each bit having the first logic value; and forming circuitry configured to receive the word from said input and to provide to said programming circuitry at least one additional word defined by bits to also be stored in said plurality of memory cells, said forming circuitry comprising a detector configured to periodically detect at least one operating parameter of the memory device, processing circuitry configured to calculate a current maximum number of simultaneously programmable bits based on a detected value of the at least one operating parameter and at least one characteristic parameter of the plurality of memory cells, and logic circuitry configured to generate the additional word, with the additional word having a number of bits having the first logic value equal to the current maximum number.

2. The non-volatile memory device according to claim 1, wherein said processing circuitry comprises at least one sampling element configured to convert the at least one operating parameter into at least one binary parameter.

3. The non-volatile memory device according to claim 2, wherein said processing circuitry comprises:

at least one first multiplier element configured to multiply the at least one binary parameter with at least one first corresponding weight for generating at least one first weighed parameter; and at least one second multiplier element configured to multiply the at least one characteristic parameter of the plurality of memory cells with at least one second corresponding weight for generating at least one second weighted parameter, with the at least one first and second corresponding weights being empirically determined.

4. The non-volatile memory device according to claim 3, wherein said processing circuitry comprises an adder element configured to add the at least one first weighed parameter and the at least one second weighed parameter together for providing the current maximum number, with the current maximum number being less than or equal to a number of bits defining the received word.

5. The non-volatile memory device according to claim 4, wherein said logic circuitry comprises a finite-state element configured to receive the word from said input and the current maximum number from said adder element, said finite-state element changing from an idle state to an analysis state upon receipt of the word, with the analysis state for verifying presence of bits having the first logic value, and when there is at least one bit having the first logic value, then changing to a forming state for generating each bit of the additional word from a corresponding bit in the word.

6. The non-volatile memory device according to claim 5, wherein said finite-state element is configured for performing the following when in the forming state:

initializing a word size and an additional word size;

checking a logic value of each bit of the received word;

generating a corresponding additional bit of the additional word to have a logic value taken by the checked data;

increasing the additional word size if the additional bit has been generated having the first logic value;

verifying exceeding of the current maximum number by the additional word size;

outputting the additional word and re-initializing the additional word size when exceeding of the current maximum number is verified;

increasing the word size when the checked bit is at the second logic value, when exceeding of the current maximum number is not verified and when the additional word is provided at the output; and verifying the reaching of a word number by the word size, repeating the checking operation of the logic value taken when the reaching is not verified, and changing to the idle state when the reaching is verified.

7. The non-volatile memory device according to claim 3, wherein the at least one operating parameter, the at least one characteristic parameter of the plurality of memory cells, and the at least one corresponding first and second weights are stored in a dedicated region of said plurality of memory cells.

8. The non-volatile memory device according to claim 1, wherein the at least one operating parameter comprises at least one of an operating temperature and a programming voltage, and wherein the at least one characteristic parameter of the plurality of memory cells comprises a current absorption by each memory cell during a storage of a bit.

9. The non-volatile memory device according to claim 8, wherein said detector comprises a conversion element configured to convert the temperature into a corresponding voltage.

10. A memory device comprising:

a plurality of memory cells;

an input configured to receive a word defined by bits to be stored in said plurality of memory cells;

programming circuitry configured to program a corresponding memory cell for each bit having a first logic value;

a detector configured to periodically detect at least one operating parameter of the memory device;

processing circuitry configured to calculate a current maximum number of simultaneously programmable bits based on a detected value of the at least one operating parameter and at least one characteristic parameter of the plurality of memory cells; and logic circuitry configured to receive the word from said input and to provide to said programming circuitry at least one additional word defined by bits to also be stored in said plurality of memory cells, with the additional word having a number of bits having the first logic value equal to the current maximum number.

11. The memory device according to claim 10, wherein said processing circuitry comprises at least one analog-to-digital converter for converting the at least one operating parameter into at least one binary parameter.

12. The memory device according to claim 11, wherein said processing circuitry comprises:

at least one first multiplier element configured to multiply the at least one binary parameter with at least one first corresponding weight for generating at least one first weighed parameter; and at least one second multiplier element configured to multiply the at least one characteristic parameter of the plurality of memory cells with at least one second corresponding weight for generating at least one second weighted parameter, with the at least one first and second corresponding weights being empirically determined.

13. The memory device according to claim 12, wherein said processing circuitry comprises an adder element configured to add the at least one first weighed parameter and the at least one second weighed parameter together for providing the current maximum number, with the current maximum number being less than or equal to a number of bits defining the received word.

14. The memory device according to claim 13, wherein said logic circuitry comprises a finite-state element configured to receive the word from said input and the current maximum number from said adder element, said finite-state element changing from an idle state to an analysis state upon receipt of the word, with the analysis state for verifying presence of bits having the first logic value, and when there is at least one bit having the first logic value, then changing to a forming state for generating each bit of the additional word from a corresponding bit in the word.

15. The memory device according to claim 14, wherein said finite-state element is configured for performing the following when in the forming state:
  initializing a word size and an additional word size;
  checking a logic value of each bit of the received word;
  generating a corresponding additional bit of the additional word to have a logic value taken by the checked data;
  increasing the additional word size if the additional bit has been generated having the first logic value;
  verifying exceeding of the current maximum number by the additional word size;
  outputting the additional word and re-initializing the additional word size when exceeding of the current maximum number is verified;
  increasing the word size when the checked bit is at a second logic value, when exceeding of the current maximum number is not verified and when the additional word is provided at the output; and
  verifying the reaching of a word number by the word size, repeating the checking operation of the logic value taken when the reaching is not verified, and changing to the idle state when the reaching is verified.

16. The memory device according to claim 13, wherein the at least one operating parameter, the at least one characteristic parameter of the plurality of memory cells, and the at least one corresponding first and second weights are stored in a dedicated region of said plurality of memory cells.

17. The memory device according to claim 11, wherein the at least one operating parameter comprises at least one of an operating temperature and a programming voltage, and wherein the at least one characteristic parameter of the plurality of memory cells comprises a current absorption by each memory cell during a storage of a bit.

18. The memory device according to claim 17, wherein said detector comprises a conversion element configured to convert the temperature into a corresponding voltage.

19. A method for programming a non-volatile memory device comprising a plurality of memory cells, the method comprising:
  receiving as input a word defined by bits to be stored in the plurality of memory cells;
  associating with each bit having a first logic value a corresponding memory cell; and
  programming the memory cell corresponding to each bit having the first logic value based on the following
    periodically detecting at least one operating parameter of the memory device,
    calculating a current maximum number of simultaneously programmable bits based on a detected value of the at least one operating parameter and at least one characteristic parameter of the plurality of memory cells of which the memory device is made, and
    providing an additional word defined by bits, with the additional word having a number of bits having the first logic value equal to the current maximum number.

20. The method according to claim 19, further comprising converting the at least one operating parameter into at least one binary parameter.

21. The method according to claim 20, further comprising:
  multiplying the at least one binary parameter with at least one first corresponding weight for generating at least one first weighed parameter; and
  multiplying the at least one characteristic parameter of the plurality of memory cells with at least one second corresponding weight for generating at least one second weighted parameter, with the at least one first and second corresponding weights being empirically determined.

22. The method according to claim 21, further comprising adding the at least one first weighed parameter and the at least one second weighed parameter together for providing the current maximum number, with the current maximum number being less than or equal to a number of bits defining the received word.

23. The method according to claim 22, wherein programming the memory cell is based on a finite-state element receiving the word from an input and the current maximum number, the finite-state element changing from an idle state to an analysis state upon receipt of the word, with the analysis state for verifying presence of bits having the first logic value, and when there is at least one bit having the first logic value, then changing to a forming state for generating each bit of the additional word from a corresponding bit in the word.

24. The method according to claim 23, wherein the finite-state element is configured for performing the following when in the forming state:
  initializing a word size and an additional word size;
  checking a logic value of each bit of the received word;
  generating a corresponding additional bit of the additional word to have a logic value taken by the checked data;
  increasing the additional word size if the additional bit has been generated having the first logic value;
  verifying exceeding of the current maximum number by the additional word size;
  outputting the additional word and re-initializing the additional word size when exceeding of the current maximum number is verified;
  increasing the word size when the checked bit is at a second logic value, when exceeding of the current maximum number is not verified and when the additional word is provided at the output; and
  verifying the reaching of a word number by the word size, repeating the checking operation of the logic value taken when the reaching is not verified, and changing to the idle state when the reaching is verified.

25. The method according to claim 19, wherein the at least one operating parameter comprises at least one of an operating temperature and a programming voltage, and wherein the at least one characteristic parameter of the plurality of memory cells comprises a current absorption by each memory cell during a storage of a bit.

* * * * *

UNITED STATES PATENT AND TRADEMARK OFFICE
CERTIFICATE OF CORRECTION

PATENT NO. : 8,644,073 B2  Page 1 of 1
APPLICATION NO. : 13/398181
DATED : February 4, 2014
INVENTOR(S) : Castagna et al.

It is certified that error appears in the above-identified patent and that said Letters Patent is hereby corrected as shown below:

In the Claims

| | |
|---|---|
| Column 9, Line 26 | Delete: "weighed" Insert: --weighted-- |
| Column 9, Line 35 | Delete: "weighed" Insert: --weighted-- |
| Column 9, Line 36 | Delete: "weighed" Insert: --weighted-- |
| Column 10, Line 49 | Delete: "weighed" Insert: --weighted-- |
| Column 10, Line 59 | Delete: "weighed" Insert: --weighted-- |
| Column 12, Line 11 | Delete: "weighed" Insert: --weighted-- |
| Column 12, Line 17 | Delete: "weighed" Insert: --weighted-- |
| Column 12, Line 18 | Delete: "weighed" Insert: --weighted-- |

Signed and Sealed this
Seventh Day of October, 2014

Michelle K. Lee
*Deputy Director of the United States Patent and Trademark Office*